United States Patent
Benjamin et al.

(10) Patent No.: US 11,544,203 B2
(45) Date of Patent: Jan. 3, 2023

(54) SEQUENCER CHAINING CIRCUITRY

(71) Applicant: Micron Technology, Inc., Boise, ID (US)

(72) Inventors: Keith A. Benjamin, Blaine, MN (US); Thomas Dougherty, Minneapolis, MN (US)

(73) Assignee: Micron Technology, Inc., Boise, ID (US)

( * ) Notice: Subject to any disclaimer, the term of this patent is extended or adjusted under 35 U.S.C. 154(b) by 225 days.

(21) Appl. No.: 16/816,615

(22) Filed: Mar. 12, 2020

(65) Prior Publication Data

US 2021/0200693 A1 Jul. 1, 2021

Related U.S. Application Data

(60) Provisional application No. 62/954,812, filed on Dec. 30, 2019.

(51) Int. Cl.
| | |
|---|---|
| *G06F 13/12* | (2006.01) |
| *G06F 1/32* | (2019.01) |
| *G05F 1/66* | (2006.01) |
| *G06F 1/3203* | (2019.01) |

(52) U.S. Cl.
CPC .............. *G06F 13/126* (2013.01); *G05F 1/66* (2013.01); *G06F 1/3203* (2013.01)

(58) Field of Classification Search
CPC ....... G06F 13/126; G05F 1/166; G05F 1/3203
USPC .......................................................... 711/114
See application file for complete search history.

(56) References Cited

U.S. PATENT DOCUMENTS

| | | | | |
|---|---|---|---|---|
| 3,986,038 | A * | 10/1976 | Short .................. | H02J 3/38 307/47 |
| 5,590,356 | A | 12/1996 | Gilberg | |
| 6,115,763 | A | 9/2000 | Douskey et al. | |
| 7,039,821 | B1 | 5/2006 | Potega | |
| 7,058,484 | B1 | 6/2006 | Potega | |
| 7,366,965 | B2 * | 4/2008 | Yamasaki .............. | G11C 29/20 365/201 |
| 7,536,519 | B2 * | 5/2009 | Murayama .......... | G06F 13/1694 711/170 |
| 10,209,727 | B2 | 2/2019 | Chapel et al. | |
| 10,614,610 | B2 * | 4/2020 | Van Benthem ....... | G06T 15/005 |
| 10,642,537 | B2 * | 5/2020 | Tokiwa ................. | G06F 3/0659 |

(Continued)

OTHER PUBLICATIONS

International Search Report and Written Opinion from related international application No. PCT/US2020/065592, dated Apr. 15, 2021, 10 page.

*Primary Examiner* — Christopher B Shin
(74) *Attorney, Agent, or Firm* — Brooks, Cameron & Huebsch, PLLC

(57) ABSTRACT

A system can include a plurality of sequencers each configured to provide a number of sequenced output signals responsive to assertion of a respective sequencer enable signal provided thereto. The system can include chaining circuitry coupled to the plurality of sequencers. The chaining circuitry can comprise logic to: responsive to assertion of a primary enable signal received thereby, assert respective sequencer enable signals provided to the plurality of sequencers in accordance with a first sequence; and responsive to deassertion of the primary enable signal, assert the respective sequencer enable signals provided to the plurality of sequencers in accordance with a second sequence.

17 Claims, 5 Drawing Sheets

(56) References Cited

U.S. PATENT DOCUMENTS

| | | | |
|---|---|---|---|
| 10,691,195 B2* | 6/2020 | Srinivas | G06F 1/263 |
| 10,732,697 B2* | 8/2020 | Srinivas | G06F 1/30 |
| 10,877,541 B1* | 12/2020 | Benjamin | G05B 15/02 |
| 11,216,308 B2* | 1/2022 | Zante | G06F 9/544 |
| 2003/0149859 A1 | 8/2003 | Hyduke | |
| 2006/0107139 A1 | 5/2006 | Lee | |
| 2007/0069765 A1 | 3/2007 | Cummings | |
| 2008/0059763 A1 | 3/2008 | Bivolarski | |
| 2012/0047376 A1 | 2/2012 | Nakajima | |
| 2015/0370296 A1* | 12/2015 | Purcell | G06F 11/221 |
| | | | 714/43 |
| 2018/0075912 A1* | 3/2018 | Shimizu | G11C 7/1042 |
| 2020/0019229 A1* | 1/2020 | Srinivas | G06F 1/3296 |
| 2020/0264788 A1* | 8/2020 | Srinivas | G06F 3/0625 |

* cited by examiner

SEQUENCER CHAINING CIRCUITRY

PRIORITY INFORMATION

This application claims priority to U.S. Provisional Application Ser. No. 62/954,812, filed on Dec. 30, 2019, the contents of which are incorporated herein by reference.

TECHNICAL FIELD

Embodiments of the disclosure relate generally to memory sub-systems, and more specifically, relate to chaining circuitry for sequencers.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to memory sub-systems that include sequencer chaining circuitry. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A sequencer is a device that can be used to control an order in which events occur in an electronic system. As one example, a sequencer can be used for power sequencing within a memory sub-system such as a dual in-line memory module (DIMM), non-volatile dual in-line memory module (NVDIMM), solid state drive (SSD), etc. For example, a memory sub-system can include various components (e.g., integrated circuits) requiring different power supply voltages (e.g., rail voltages) which often need to be supplied in a particular order and/or for a particular duration in order to comply with system specifications (e.g., to prevent lock-up during power-up and/or power-down). Example components often requiring sequencing can include core logic such as a microprocessor, input/output (I/O) circuitry, and various auxiliary circuits such as phase-locked loops among various other circuitry that can require different supply rails.

Conventional sequencers have a limited quantity of output channels, which might be 3, 4, 5, or 6. Various electronic systems can require sequencing of more outputs than are provided by a particular sequencer. Employing multiple separate sequencers to provide a required quantity of output channels can be problematic since there is not a direct way to sequence continuously from one sequencer to the next while maintaining strict timing requirements such as may be needed for power sequencing, for example.

Aspects of the present disclosure address the above and other deficiencies by providing sequencer chaining circuitry that can be scaled to support sequencer output requirements of various systems. Embodiments of the present disclosure employ chaining circuitry used to connect separate sequencers (e.g., separate integrated circuits) in a feed-forward and/or feed-backward manner to ensure proper timing during sequencing in both a forward and reverse order. Although various examples herein refer to power supply sequencing, embodiments are not so limited. That is, sequencer chaining circuitry described herein can be used in various other contexts associated with an electronic system, such as command selection, command processing, etc.

Figure 1:
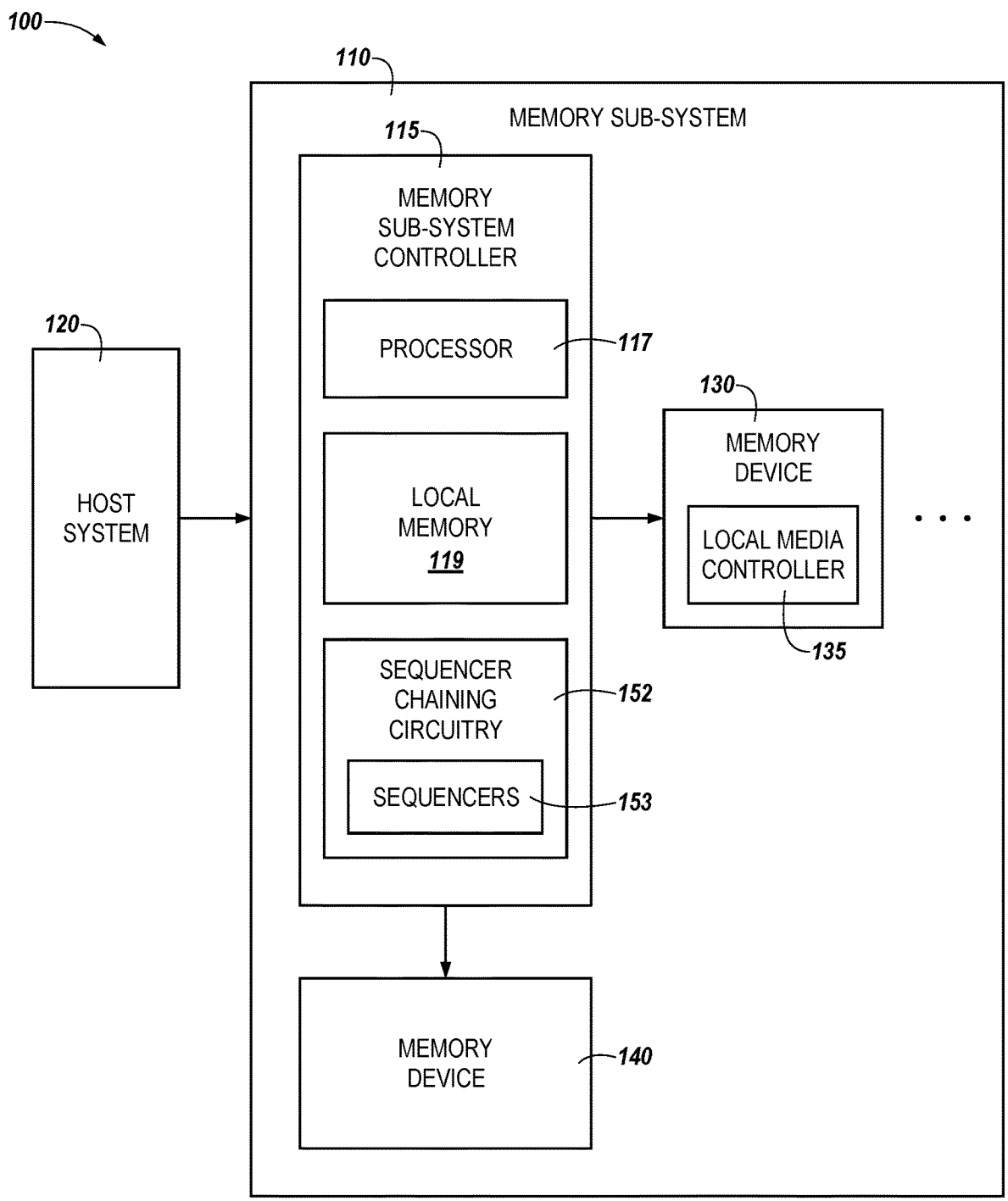
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a desktop computer, laptop computer, network server, mobile device, a vehicle (e.g., automobile, airplane, drone, train, or other conveyance), Internet of Things (IoT) enabled device, embedded computer (e.g., one included in a vehicle, industrial equipment, or a networked commercial device), or such computing device that includes memory and a processing device (e.g., a processor).

The computing system 100 can include a host system 120 that is coupled to one or more memory sub-systems 110. In some embodiments, the host system 120 is coupled to different types of memory sub-systems 110. FIG. 1 illustrates an example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include not-AND (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point array of non-volatile memory cells and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), not-OR (NOR) flash memory, and electrically erasable programmable read-only memory (EEPROM).

A memory sub-system controller 115 (or controller 115 for simplicity) can communicate with the memory devices 130 and/or 140 to perform operations such as reading data, writing data, or erasing data at the memory devices 130 and/or 140 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include processing device such as a processor 117 configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code, for example. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 and/or 140 as well as convert responses associated with the memory devices 130/140 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130/140 include a local media controller 135 that operates in conjunction with memory sub-system controller 115 to execute operations on one or more memory cells of the memory devices 130/140. An external controller (e.g., memory sub-system controller 115) can externally manage the memory devices 130/140 (e.g., perform media management operations on the memory devices). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system controller 115 can also include power sequencer chaining circuitry 152 coupled to a number of sequencers 153, which can serve as a sequencing network in accordance with various embodiments of the present disclosure (e.g., the sequencing networks described below in association with FIG. 2 and FIG. 3). As described in association with FIG. 2 and FIG. 3, the sequencer chaining circuitry 152 (e.g., 252 in FIG. 2) can include a number of logic gates (e.g., AND gates and OR gates) and can be configured to assert respective sequencer enable signals provided to the chained sequencers 153 in accordance with a first sequence responsive to assertion of a primary enable signal. The chaining circuitry 152 can also be configured to assert the respective sequencer enable signals provided to the plurality of chained sequencers 153 in accordance with a second sequence responsive to deassertion of the primary enable signal. Although the sequencer chaining circuitry 152 and sequencers 153 are shown as part of controller 115, embodiments are not so limited. For example, the circuitry 152 and/or 153 may be implemented external to the controller 115, such as on the host 120 or elsewhere in the memory sub-system 110 (e.g., independently or as part of a power management integrated circuit).

Figure 2:
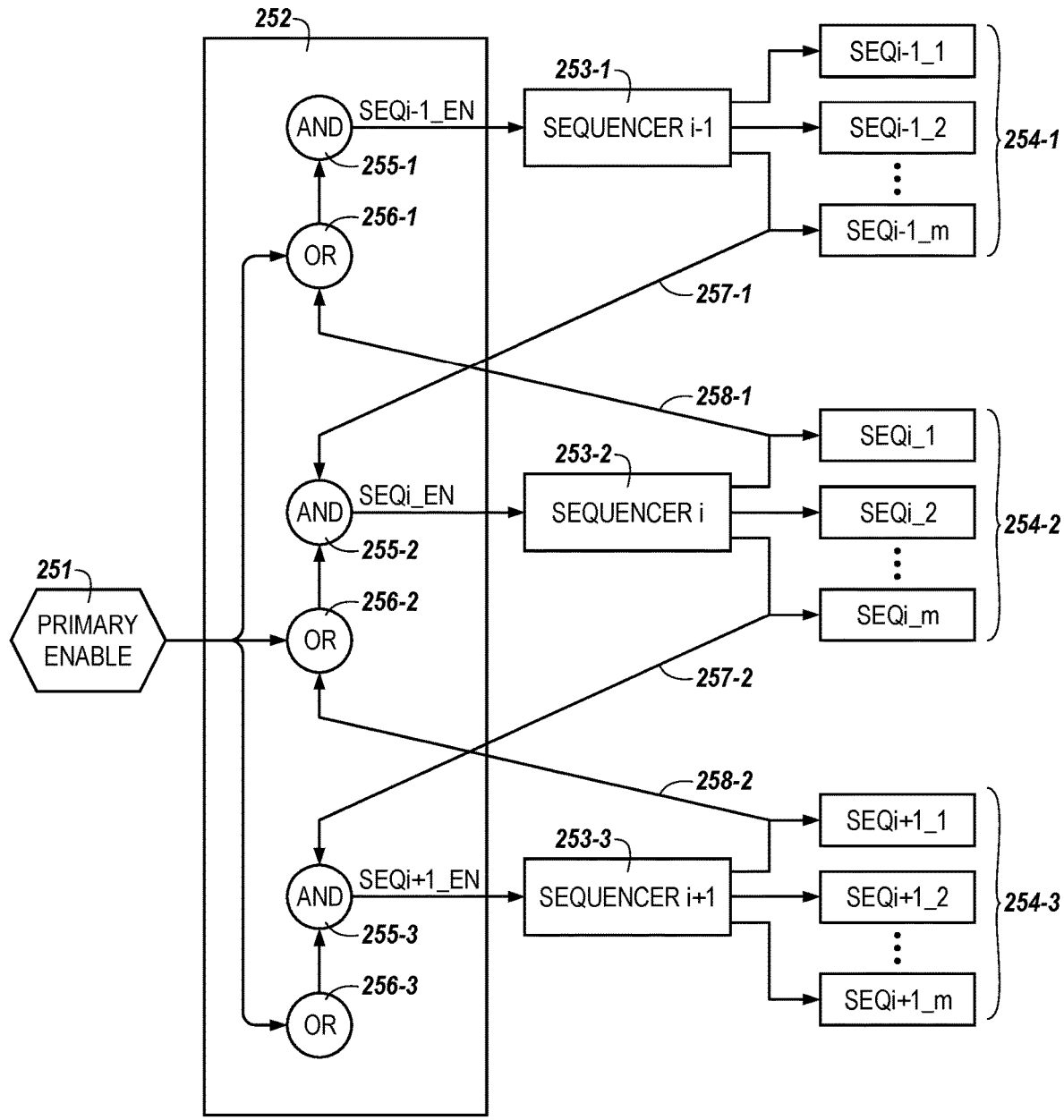
FIG. 2 illustrates an example of sequencer chaining circuitry in accordance with some embodiments of the present disclosure.

FIG. 2 illustrates an example of a chained sequencer network in accordance with a number of embodiments of the present disclosure. In this example, the chained network includes three sequencers 253-1 (SEQUENCER i−1), 253-2 (SEQUENCER i), and 253-3 (SEQUENCER i+1) coupled to the sequencer chaining circuitry 252 and referred to collectively as sequencers 253. The sequencer chaining circuitry 252 is analogous to sequencer chaining circuitry 152 in FIG. 1. Each of the sequencers 253 comprises "m" outputs (e.g., channels) provided to respective components. In this example, the outputs of sequencer 253-1 are provided to respective ones of components 254-1 (shown as SEQi−1_1, SEQi−1_2, . . . , SEQi−1_m), the outputs of sequencer 253-2 are provided to respective ones of components 254-2 (shown as SEQi_1, SEQi 2, . . . , SEQi_m), and the outputs of sequencer 253-3 are provided to respective ones of components 254-3 (shown as SEQi+1_1, SEQi+1_2, . . . , SEQi+1_m). The components 254-1, 254-2, and 254-3 can be, for example, voltage regulators configured to provide power rails to a power sequence dependent device such as a memory device. Accordingly, the output signals of the sequencers 253 can be enable signals, for example.

The sequencers 253 can be separate sequencers (e.g., separate integrated circuits). The sequencers 253-1, 253-2, and 253-3 are enabled and disabled via respective sequencer enable signals SEQi−1_EN, SEQi_EN, and seQi+1_EN provided via the chaining circuitry 252. When enabled, the sequencers 253 are configured to provide their respective output signals in a particular order (e.g., from 1 to m). The sequencers 253 can be configured to provide their respective output signals in a reverse order (e.g., m to 1) responsive to being disabled (e.g., via deassertion of their respective sequencer enable signals). As described herein, the chaining circuitry 252 is configured to provide the sequencer enable signals SEQi−1_EN, SEQi_EN, and seQi+1_EN to the respective sequencers 253-1, 253-2, and 253-3 according to a first sequence responsive to assertion of a primary enable signal 251 provided thereto and according to a second sequence responsive to deassertion of the primary enable signal 251. As an example, the primary enable signal 251 can be asserted (e.g., via a host system such as 120 or a processing device 117) in association with powering up a memory sub-system such as an NVDIMM and can be deasserted in association with powering down the memory sub-system. Therefore, it can be beneficial to enable/disable the sequencers 253 in a particular order to avoid adverse effects such as violating power-up/down sequence requirements. In a number of embodiments, the order in which the sequencers 253 are disabled (e.g., during device power-down) is a reverse order of that in which the sequencers are enabled (e.g., during device power-up).

As shown in FIG. 2, the chaining circuitry 252 comprises a number of AND gates 255-1, 255-2, and 255-3 (referred to collectively as gates 255) and a number of OR gates 256-1, 256-2, and 256-3 (referred to collectively as gates 256). In this example, each of the sequencers 253 have an AND gate 255 and an OR gate 256 corresponding thereto. The primary enable signal 251 is provided to each of the OR gates 256. In this example, an output of each of the OR gates 255 is provided as an input to a corresponding AND gate 255. The outputs of the AND gates 255 provide the sequencer enable signals SEQi−1_EN, SEQi_EN, and seQi+1_EN to the sequencers 253.

As shown in FIG. 2, particular ones of the sequencer output signals are provided (e.g., fed back) to logic gates 255/256 corresponding to next and/or prior sequencers 253 in the chained configuration to facilitate enabling the sequencers 253 in a particular order. For instance, sequencer output signal 257-1 of sequencer 253-1 is provided as an input to AND gate 255-2 corresponding to sequencer 253-2. Similarly, sequencer output signal 257-2 of sequencer 253-2 is provided as an input to AND gate 255-3 corresponding to sequencer 253-3. Also, sequencer output signal 258-1 of sequencer 253-2 is provided as an input to OR gate 256-1 corresponding to sequencer 253-1, and sequencer output signal 258-2 of sequencer 253-3 is provided as an input to OR gate 256-2 corresponding to sequencer 253-2. In this manner, responsive to assertion of the primary enable signal 251, sequencer 253-2 will not be enabled (via enable signal SEQi_EN) until sequencer output signal 257-1 is asserted, and sequencer 253-3 will not be enabled (via enable signal SEQi+1_EN) until sequencer output signal 257-2 is asserted. In a similar manner, responsive to deassertion of the primary enable signal 251, sequencer 253-2 will not be disabled until sequencer output signal 258-2 is deasserted, and sequencer 253-1 will not be disabled until sequencer output signal 258-1 is deasserted In operation, responsive to an assertion of the primary enable signal 251, the sequencers 253 are enabled in order with sequencer 253-1 being enabled first, followed by sequencer 253-2 and then sequencer 253-3. That is, initially sequencer 253-1 is enabled via assertion of the output of AND gate 255-1 (via assertion of the output of OR gate 256-1) due to assertion of primary enable signal 251. Sequencers 253-2 and 253-2 are disabled initially since one of the inputs of their respective corresponding AND gates 255-2 and 255-3 are deasserted. Once sequencer output 257-1 is asserted, both inputs to AND gate 255-2 are asserted and its output (SEQi_EN) is asserted to enable sequencer 253-2 (while sequencer 253-3 remains disabled). Once sequencer output 257-2 is asserted, both inputs to AND gate 255-3 are asserted and its output (SEQi+1_EN) is asserted to enable sequencer 253-3. It is noted that sequencer output signals 258-1 and 258-2 remain asserted in order to maintain the prior sequencers 253 in the chain in an enabled state responsive to deassertion of the primary enable signal 251 (e.g., during power-down).

Responsive to the a subsequent deassertion of primary enable signal 251, the configuration of the chaining circuitry 252 allows the sequencers 253 to operate in the reverse sequence (e.g., sequencer 253-3 being disabled prior to disabling of sequencer 253-2, and sequencer 253-2 being disabled prior to disabling of sequencer 253-1). For instance, responsive to deassertion of enable signal 251, sequencer 253-3 will be disabled first as the output of OR gate 256-3 deasserts such that the output of AND gate 255-3 deasserts. In contrast, sequencer 253-2 initially remains enabled responsive to the deassertion of enable signal 251 because both of the inputs (sequencer output signal 257-1 and sequencer output signal 258-2) to corresponding AND gate 255-2 remain asserted (e.g., logic high). Once signal 258-2 is deasserted by sequencer 253-1, the output of OR gate 256-2 deasserts, which then causes deassertion of the sequencer enable signal SEQi_EN being output from AND gate 255-2. Similarly, once sequencer output signal 258-1 is deasserted by sequencer 253-2, the output of OR gate 256-1 deasserts causing deassertion of the sequencer enable signal SEQi−1_EN being output from AND gate 255-1.

Figure 3:
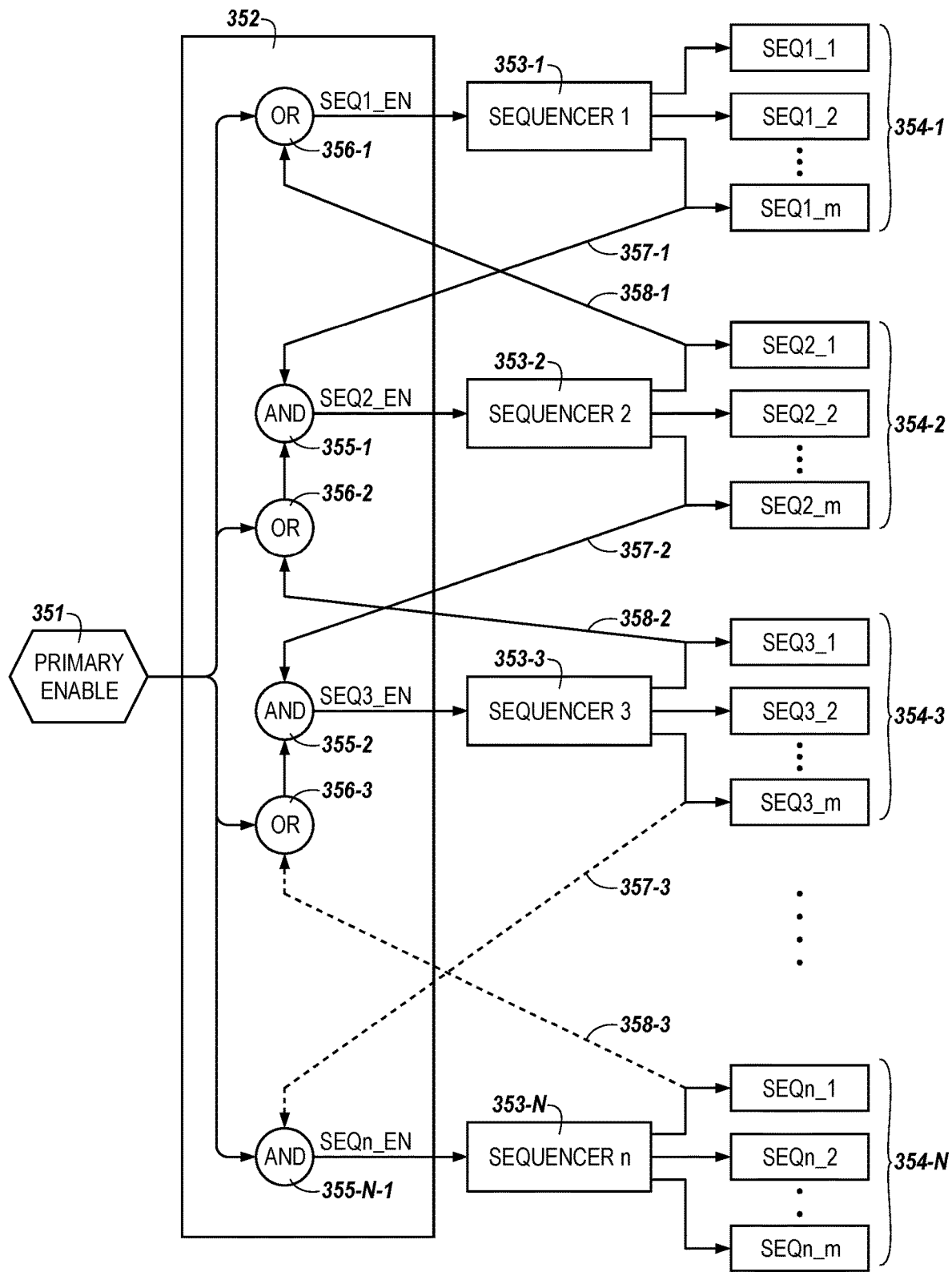
FIG. 3 illustrates an example of sequencer chaining circuitry in accordance with some embodiments of the present disclosure.

FIG. 3 illustrates an example of a chained sequencer network in accordance with a number of embodiments of the present disclosure. In this example, the chained network includes sequencers 353-1 (SEQUENCER 1), 353-2 (SEQUENCER 2), 353-3 (SEQUENCER 3), . . . , 353-N (SEQUENCER n) coupled to the sequencer chaining circuitry 352 and referred to collectively as sequencers 353. The sequencer chaining circuitry 352 is analogous to sequencer chaining circuitry 152 in FIG. 1. Each of the sequencers 353 comprises "m" outputs (e.g., channels) provided to respective components. In this example, the outputs of sequencer 353-1 are provided to respective ones of components 354-1 (shown as SEQ1_1, SEQ1_2, . . . , SEQ1_$m$), the outputs of sequencer 353-2 are provided to respective ones of components 354-2 (shown as SEQ2_1, SEQ2_2, . . . , SEQ2_$m$), the outputs of sequencer 353-3 are provided to respective ones of components 354-3 (shown as SEQ3_1, SEQ3_2, . . . , SEQ3_$m$) and the outputs of sequencer 353-N are provided to respective ones of components 354-N (shown as SEQn_1, SEQn_2, . . . , SEQn_m). The components 354-1, 354-2, 354-3, . . . , 354-N can be, for example, voltage regulators configured to provide power rails to a power sequence dependent device such as a memory device. Accordingly, the output signals of the sequencers 353 can be enable signals, for example.

The chaining circuitry 352 is configured to control enabling and disabling of the sequencers 353 via assertion and deassertion of respective sequencer enable signals SEQ1_EN, SEQ2_EN, SEQ3_EN, . . . , SEQn_EN. The sequencers 353 are coupled in a chained configuration via feedback of sequencer output signals (e.g., 357-1, 357-2, 357-3, 358-1, 358-2, and 358-3) to the chaining circuitry 352 such that the sequencer outputs are asserted in a particular order (e.g., forward and reverse).

The example shown in FIG. 3 is similar to the example shown in FIG. 2. For example, the chaining circuitry 352 includes a number of OR gates 356-1, 356-2, 356-3 and a number of AND gates 355-1, 355-2, and 355-N-1. However, in the example shown in FIG. 3, the first sequencer 353-1 in the chain includes a single OR gate 356-1 corresponding thereto, and the last sequencer 353-N in the chain includes a single AND gate 355-N−1 corresponding thereto. Each of the other sequencers 353 have an OR gate 356 and an AND gate 355 corresponding thereto. The reduction of logic gates 355/356 per sequencer of circuitry 352 as compared to circuitry 252 is due to removal of the AND gate (e.g., 255-1) corresponding to the first sequencer in the chain and removal of the OR gate (e.g., 256-3) corresponding to the last sequencer in the chain because those gates become redundant as single input gates.

As shown in FIG. 3 and as described above in association with FIG. 2, particular outputs of the sequencers 353 are provided to particular logic gates 355/356 corresponding to next and/or prior sequencers 353 in the chained configuration to facilitate enabling the sequencer outputs in a particular order (e.g., due to assertion of the primary enable signal 351) or reverse order (e.g., due to deassertion of signal 351). For example, the output signal 357-1 provided to component "SEQ1_$m$" from sequencer 353-1 is also provided to an input of the AND gate 355-1 corresponding to sequencer 353-2, the output signal 357-2 provided to component "SEQ2_$m$" from sequencer 353-2 is also provided to an input of the AND gate 355-2 corresponding to sequencer 353-3, and the output signal 357-3 provided to component "SEQ3_$m$" from sequencer 353-3 is also provided to an input of the AND gate 355-N-1 corresponding to sequencer 353-N. Similarly, the output signal 358-3 provided to component "SEQn_1" from sequencer 353-N is also provided to an input of the OR gate 356-3 corresponding to sequencer 353-3, the output signal 358-2 provided to component "SEQ3_1" from sequencer 353-3 is also provided to an input of the OR gate 356-2 corresponding to sequencer 353-2, and the output signal 357-1 provided to component "SEQ2_1" from sequencer 353-2 is also provided to an input of the OR gate 356-1 corresponding to sequencer 353-1.

In operation, the configuration of the sequencer chaining circuitry 352 and sequencers 353 provides for sequencing output signals in order from the first sequencer 353-1 to the last sequencer 353-N responsive to assertion of the primary enable signal 351. Additionally, the configuration of the circuitry 352 provides for sequencing output signals in reverse order from the last sequencer 353-N to the first sequencer 353-1 responsive to deassertion of the primary enable signal 351. In embodiments in which the components 354 are voltage regulators such as described in association with FIG. 2, the circuitry can be used to provide sequenced power rails to a power sequence dependent device. That is, the sequenced power signals can be provided in a first order during power-up of the device and in a reverse order during power-down (e.g., due to a transient low power event or otherwise).

Figure 4:
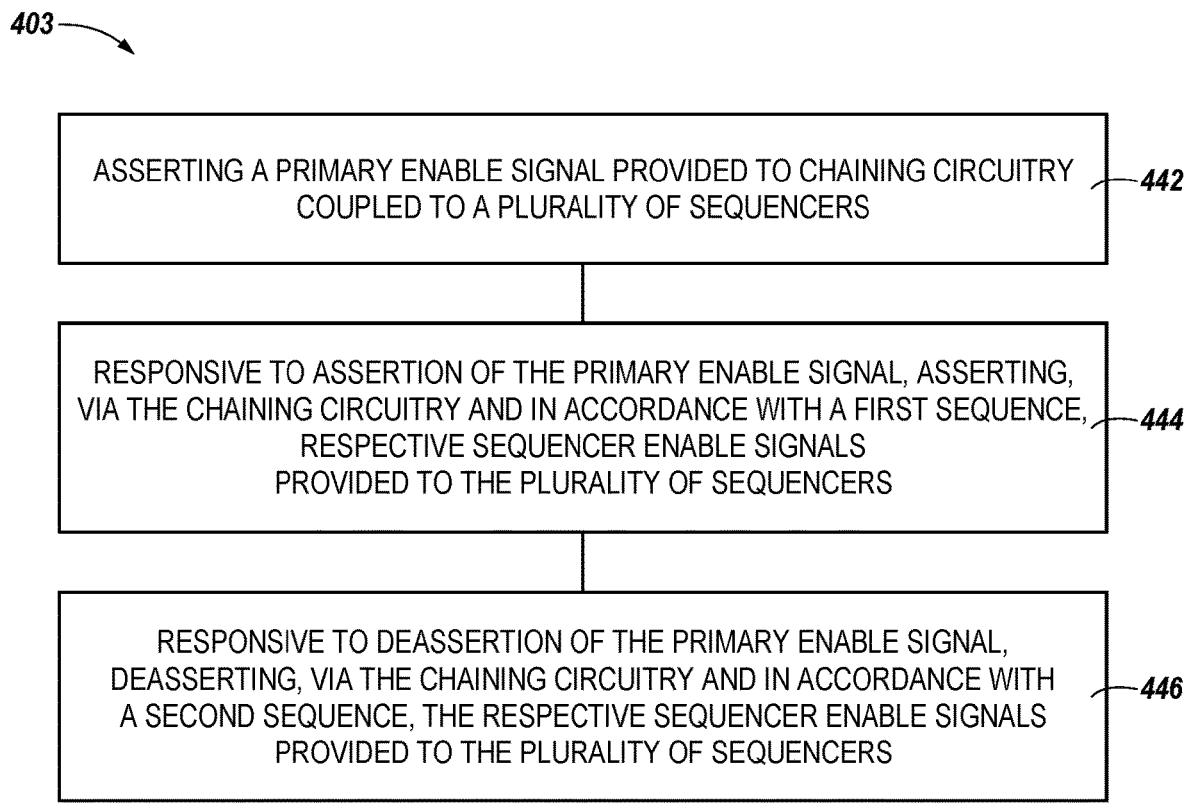
FIG. 4 is a flow diagram of an example method for operating sequencer chaining circuitry in accordance with some embodiments of the present disclosure.

FIG. 4 is a flow diagram of an example method 403 for operating sequencer chaining circuitry in accordance with some embodiments of the present disclosure. The method 403 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 403 is performed by the sequencer chaining circuitry 262 of FIG. 2 or 362 of FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 442, a primary enable signal provided to chaining circuitry coupled to a plurality of sequencers is asserted. The primary enable signal can be asserted via a processing resource and can be asserted in association with powering up a memory sub-system, for example.

At operation 444, responsive to assertion of the primary enable signal, respective sequencer enable signals provided to the plurality of sequencers can be asserted via the chaining circuitry and in accordance with a first sequence.

At operation 446, responsive to deassertion of the primary enable signal, the respective sequencer enable signals provided to the plurality of sequencers can be deasserted via the chaining circuitry and in accordance with a second sequence. In a number of embodiments, the second sequence is a reverse order of the first sequences. The plurality of sequencers can be separate integrated circuits, and an output signal of each of the plurality of sequencers can be provided to an input of at least one of a plurality of logic gates (e.g., AND and/or OR gates) of the chaining circuitry. In a number of embodiments, the plurality of sequencers comprises at least three sequencers configured to sequence power rails in association with powering up and powering down a memory device. However, one of ordinary skill in the art will appreciate that embodiments are not limited to chaining circuitry corresponding to three (or more) sequencers. For example, two sequencers can be chained together via a sole OR gate corresponding to a first sequencer and a sole AND gate corresponding to a last sequencer in the chain.

Figure 5:
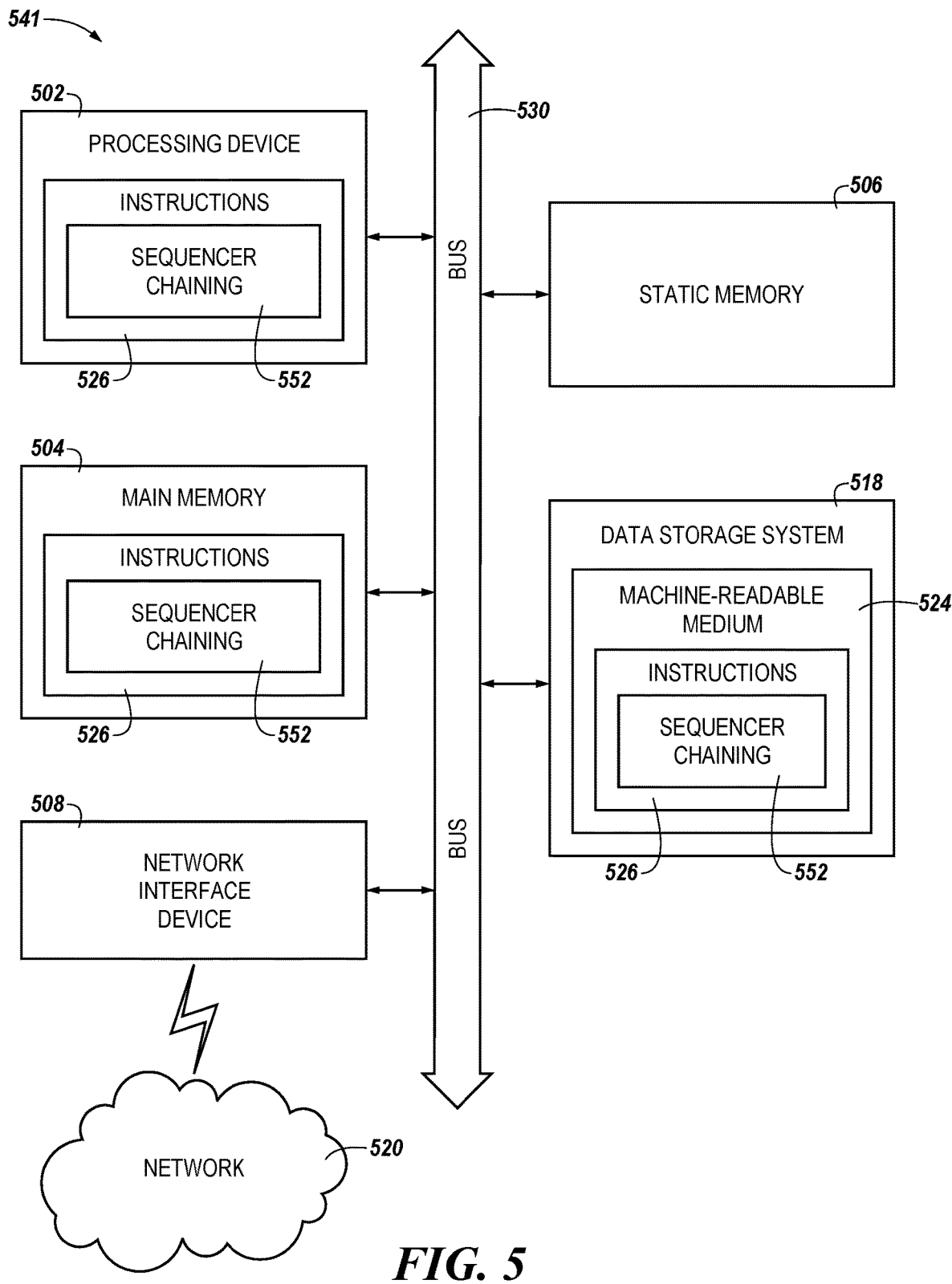
FIG. 5 is a block diagram of an example computer system in which embodiments of the present disclosure may operate.

FIG. 5 illustrates an example machine of a computer system 541 within which a set of instructions, for causing the machine to perform one or more of the methodologies discussed herein, can be executed. In some embodiments, the computer system 541 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the sequencer chaining circuitry 152 and/or sequencers 153 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or another machine capable of executing a set of instructions (sequential or otherwise) that specify actions to be taken by that machine. Further, while a single machine is illustrated, the term "machine" shall also be taken to include a collection of machines that individually or jointly execute a set (or multiple sets) of instructions to perform one or more of the methodologies discussed herein.

The example computer system 541 includes a processing resource 502 (e.g., a processing device), a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 541 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 541, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions 552 to implement functionality corresponding to the sequencer chaining circuitry 152 of FIG. 1. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include a medium that is capable of storing or encoding a set of instructions for execution by the machine and that cause the machine to perform one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, types of disk including floppy disks, optical disks, CD-ROMs, and magnetic-optical disks, read-only memories (ROMs), random access memories (RAMs), EPROMs, EEPROMs, magnetic or optical cards, or type of media suitable for storing electronic instructions, each coupled to a computer system bus.

The algorithms and displays presented herein are not inherently related to a particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to a particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes a mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system, comprising:
    a plurality of sequencers each configured to provide a number of sequenced output signals responsive to assertion of a respective sequencer enable signal provided thereto; and
    chaining circuitry coupled to the plurality of sequencers and comprising logic to:
        responsive to assertion of a primary enable signal received thereby, assert respective sequencer enable signals provided to the plurality of sequencers in accordance with a first sequence; and
        responsive to deassertion of the primary enable signal, assert the respective sequencer enable signals provided to the plurality of sequencers in accordance with a second sequence,
    wherein the chaining circuitry comprises:
        a first logic gate configured to receive the primary enable signal as a first input and output a first sequencer enable signal to a first sequencer of the plurality of sequencers; and
        a second logic gate configured to receive an output signal of the first sequencer as a first input and output a second sequencer enable signal to a second sequencer of the plurality of sequencers.

2. The system of claim 1, wherein the second sequence is a reverse order of the first sequence.

3. The system of claim 1, wherein the sequenced output signals are provided to a number of components of the system.

4. The system of claim 3, wherein is the number of components comprise a number of voltage regulators whose outputs are provided to a number of memory devices of the system.

5. The system of claim 1, wherein the first logic gate is one of an OR gate or an AND gate and the second logic gate is the other of the OR gate or the AND gate.

6. The system of claim 5, wherein the chaining circuitry further comprises a third logic gate having an output coupled to the second logic gate as a second output of the second logic gate, and wherein the third logic gate is configured to:
    receive the primary enable signal as a first input; and
    receive an output signal of a third sequencer of the plurality of sequencers as a second input.

7. The system of claim 6, wherein the third logic gate is an OR gate.

8. The system of claim 1, wherein each of the plurality of sequencers is a separate sequencer.

9. The system of claim 1, wherein the system is a memory sub-system with the outputs of the plurality of sequencers being provided to a plurality of voltage regulators providing power rails to components of a memory device.

10. A method, comprising:
    asserting a primary enable signal provided to chaining circuitry coupled to a plurality of sequencers;
    responsive to assertion of the primary enable signal, asserting, via the chaining circuitry and in accordance with a first sequence, respective sequencer enable signals provided to the plurality of sequencers;
    responsive to deassertion of the primary enable signal, deasserting, via the chaining circuitry and in accordance with a second sequence, the respective sequencer enable signals provided to the plurality of sequencers; wherein the chaining circuitry comprises:
- a first logic gate configured to receive the primary enable signal as a first input and provide its output as an input of a second logic gate, wherein an output of the second logic gate is a sequencer enable signal provided to a first sequencer of the plurality of sequencers; and
- a third logic gate configured to receive an output signal of the first sequencer as a first input and an output of a fourth logic gate as a second input, wherein an output of the third logic gate is a sequencer enable signal provided to a second sequencer of the plurality of sequencers.

11. The method of claim 10, further comprising receiving, via the fourth logic gate, the primary enable signal as a first input and an output signal of a third sequencer of the plurality of sequencers as a second input.

12. The method of claim 10, wherein the plurality of sequencers are separate sequencer integrated circuits, wherein the chaining circuitry comprises a plurality of logic gates, and wherein the method includes providing an output signal of each of the plurality of sequencers to an input of at least one of the plurality of logic gates.

13. The method of claim 10, wherein the plurality of sequencers comprises at least three sequencers, and wherein the least three sequencers are configured to sequence power rails in association with powering up and powering down a memory device.

14. The method of claim 10, wherein the chaining circuitry comprises a plurality of logic OR gates, and wherein the method comprises providing the master enable signal to the plurality of logic OR gates.

15. A system, comprising:
- a first sequencer configured to provide a first plurality of sequenced output signals;
- a second sequencer configured to provide a second plurality of sequenced output signals; and
- a third sequencer configured to provide a third plurality of sequenced output signals;
- wherein the first, second, and third sequencers are coupled, via chaining circuitry, in a feed-forward and a feed-backward manner such that:
  - responsive to assertion of a primary enable signal provided to the chaining circuitry, sequencer enable signals provided to the respective first, second, and third sequencers are asserted in a first order; and
  - responsive to a subsequent deassertion of the primary enable signal, the sequencer enable signals provided to the respective first, second, and third sequencers are deasserted in a second order; and
- wherein one of the sequenced output signals of the second plurality of sequenced output signals is provided to a first logic gate associated with the sequencer enable signal corresponding to the first sequencer, and wherein another one of the sequenced output signals of the second plurality of sequenced output signals is provided to a second logic gate associated with the sequencer enable signal corresponding to the third sequencer.

16. The system of claim 15, wherein the chaining circuitry comprises a plurality of logic AND gates and a plurality of logic OR gates.

17. The system of claim 15, wherein the system comprises a non-volatile dual in-line memory module, and wherein the first, second, and third plurality of sequenced output signals are provided to voltage regulators configured to provide rail voltage signals to a number of memory devices.

* * * * *